United States Patent
Lim et al.

(10) Patent No.: US 11,287,738 B2
(45) Date of Patent: Mar. 29, 2022

(54) METHOD FOR PRODUCING DECORATION SHEET HAVING MICROPATTERN

(71) Applicant: LG Hausys, Ltd., Seoul (KR)

(72) Inventors: Geo-Hyeok Lim, Boryeong-si (KR); Seung-Hun Lee, Seoul (KR); Ji-Yong Park, Gimhae-si (KR); Han-Na Lee, Ansan-si (KR)

(73) Assignee: LG HAUSYS, LTD., Seoul (KR)

( * ) Notice: Subject to any disclaimer, the term of this patent is extended or adjusted under 35 U.S.C. 154(b) by 0 days.

(21) Appl. No.: 16/348,629

(22) PCT Filed: Oct. 31, 2017

(86) PCT No.: PCT/KR2017/012130
§ 371 (c)(1),
(2) Date: May 9, 2019

(87) PCT Pub. No.: WO2018/088746
PCT Pub. Date: May 17, 2018

(65) Prior Publication Data
US 2019/0310546 A1    Oct. 10, 2019

(30) Foreign Application Priority Data

Nov. 10, 2016  (KR) .................. 10-2016-0149795

(51) Int. Cl.
*G03F 7/00*   (2006.01)
*G03F 7/38*   (2006.01)
(Continued)

(52) U.S. Cl.
CPC ............ *G03F 7/0002* (2013.01); *B32B 27/06* (2013.01); *G03F 7/00* (2013.01); *G03F 7/20* (2013.01); *G03F 7/38* (2013.01)

(58) Field of Classification Search
CPC . G03F 7/0002; G03F 7/00; G03F 7/20; G03F 7/38; D21H 19/82; D21H 19/80;
(Continued)

(56) References Cited

U.S. PATENT DOCUMENTS 7,205,092 B2 * 4/2007 Ichikawa ................ G03F 7/202
430/273.1
7,972,681 B2    7/2011 Roys et al.

FOREIGN PATENT DOCUMENTS

EP    1975704 A2 * 10/2008 ............ B82Y 40/00
EP    2181845 A1 *  5/2010 ............ B32B 25/08
(Continued)

OTHER PUBLICATIONS

International Search Report dated Feb. 8, 2018, corresponding to International Application No. PCT/KR2017/012130 citing the above reference(s).

*Primary Examiner* — William P Fletcher, III
(74) *Attorney, Agent, or Firm* — Hauptman Ham, LLP

(57) ABSTRACT

Provided are a decoration sheet and a method for producing same. The decoration sheet sequentially includes a thermosetting resin layer, a deposition layer, and a base layer. The thermosetting resin layer has a micropattern on a surface thereof, and the elongation rate of the sheet is 200% to 300%. The method includes forming a photocurable imprint film having a first pattern on a first surface thereof, forming a thermosetting resin layer having a second pattern, which has a reverse phase to the first pattern, on a first surface thereof, forming a deposition layer on a second surface of the thermosetting resin layer, forming a substrate layer on one surface of the deposition layer, and releasing the photocurable imprint film from the thermosetting resin layer.

9 Claims, 3 Drawing Sheets

(51) Int. Cl.
*B32B 27/06* (2006.01)
*G03F 7/20* (2006.01)

(58) Field of Classification Search
CPC ..... D21H 27/30; D21H 27/26; B41M 7/0054; B05D 3/06; B05D 3/065; B05D 7/52; B05D 7/56; B32B 27/06
See application file for complete search history.

(56) References Cited

FOREIGN PATENT DOCUMENTS

| | | | | |
|---|---|---|---|---|
| JP | H0664358 A | * | 8/1994 | |
| JP | 2000301681 A | * | 10/2000 | |
| JP | 4455058 B2 | * | 4/2010 | ........... B29C 59/046 |
| JP | 2017205992 A | * | 11/2017 | |
| KR | 10-2002-0010379 A | | 2/2002 | |
| KR | 20020010379 A | * | 2/2002 | |
| KR | 10-0701652 B1 | | 3/2007 | |
| KR | 10-0799318 B1 | | 1/2008 | |
| KR | 10-0820300 B1 | | 4/2008 | |
| KR | 10-2010-0030927 A | | 3/2010 | |
| KR | 10-2010-0136082 A | | 12/2010 | |
| KR | 10-2014-0094260 A | | 7/2014 | |
| KR | 20-2014-0004296 U | | 7/2014 | |
| KR | 2020140004296 A | * | 7/2014 | |

\* cited by examiner

METHOD FOR PRODUCING DECORATION SHEET HAVING MICROPATTERN

CROSS REFERENCE TO RELATED APPLICATION

This present application is a national stage filing under 35 U.S.C § 371 of PCT application number PCT/KR2017/012130 filed on Oct. 31, 2017 which is based upon and claims the benefit of priority to Korean Patent Application No. 10-2016-0149795, filed on Nov. 10, 2016 in the Korean Intellectual Property Office. The disclosures of the above-listed applications are hereby incorporated by reference herein in their entirety.

TECHNICAL FIELD

A deposited decoration sheet having a fine pattern and excellent formability, and a method for manufacturing such a deposited decoration sheet are disclosed herein.

BACKGROUND ART

Decoration sheets are generally difficult to process and are not easy to handle. Natural materials such as wood, metal, and bricks are manufactured artificially using a film so that the decoration sheets have surface effects similar to the natural materials, and the decoration sheets are used as indoor wallpapers and finish of buildings and decorative paper of furniture or various kinds of electronic products. A laminate in which a base sheet, a design layer, a layer of synthetic resin, for example, are laminated is used as the decoration sheet. In order to protect an outermost surface of the decoration sheet, the surface of the decoration sheet is generally protected. Particularly, it is known that thermosetting resin or UV curable resin is used for a surface protective layer to improve abrasion-resistance, scratch-resistance, and the like.

According to the related art, Korean Patent Laid-Open Publication No. 2010-0136082 discloses a method for manufacturing an interior sheet using UV-hard coating and UV-curable adhesive as a method for manufacturing a decoration sheet using UV-curable resin. Korean Patent No. 10-701652 discloses a polypropylene film as an environment-friendly material. Korean Patent No. 10-820300 discloses technology for manufacturing an environment-friendly interior sheet having an improved surface strength by UV-curing coating on the polyester film.

DISCLOSURE

Technical Problem

According to an embodiment of the present disclosure, there is provided a decoration sheet sequentially including a layer of thermosetting resin, a deposition layer, and a substrate layer, and the layer of the thermosetting resin has a fine pattern on a surface thereof and elongation of the sheet is 200% to 300%.

According to another embodiment of the present disclosure, there is provided a method for manufacturing the decoration sheet.

However, the technical problem to be solved by the present disclosure is not limited to the above-mentioned problems, and other problems not mentioned can be clearly understood by those skilled in the art from the following description.

Technical Solution

In an embodiment of the present disclosure, a decoration sheet is provided. The decoration sheet sequentially includes a layer of thermosetting resin, a deposition layer, and a substrate layer and the layer of the thermosetting resin includes a fine pattern on a surface thereof, and elongation of the sheet is about 200% to about 300%.

Accordingly, the decoration sheet that may be applied to in-mold, insert, and a three-dimensional overlay method (TOM) may have a fine pattern and high elongation.

The layer of the thermosetting resin may have an average thickness of about 5 µm to about 50 µm. If the layer of the thermosetting resin has an average thickness less than the above range, the kinds of the fine pattern that may be embodied in relation to the depth is limited. When the average thickness of the layer of the thermosetting resin exceeds the above range, the elongation of the decoration sheet is rapidly reduced.

In another embodiment of the present disclosure, there is provided a method for manufacturing a decoration sheet, comprising: forming a photocurable imprint film in which a layer of photocurable resin including an original pattern and a transparent layer are laminated on another surface of the layer of the photocurable resin; applying and thermo-curing coating liquid of the thermosetting resin on one surface of the layer of the photocurable resin including an original pattern of the layer of photocurable resin to form the layer of photocurable resin including a pattern having a reverse phase to the original pattern on the surface in contact with the layer of the photocurable resin; forming a deposition layer on another surface of the layer of the thermosetting resin; forming a substrate layer on one surface of the deposition later; and releasing the photocurable imprint film from the layer of the thermosetting resin.

Advantageous Effects

The decoration sheet, to which in-mold, insert and a three-dimensional overlay method (TOM) are applied, may have a fine pattern and high elongation. Specifically, the fine patterns may be formed to embody delicate patterns, thereby improving an interior function. A layer of thermosetting resin is used to have excellent elongation of the decoration sheet, thereby improving formability of the decoration sheet.

BEST MODE

Figure 1:
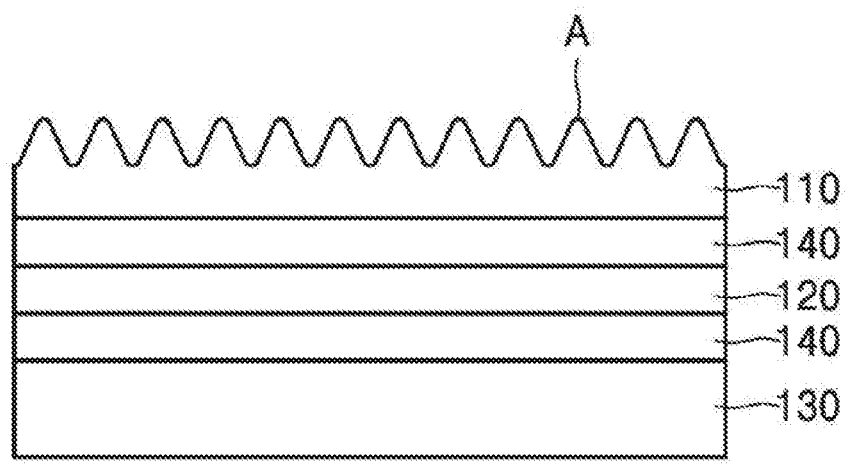
FIG. 1 is a schematic cross-sectional view of a decoration sheet according to an embodiment of the present disclosure.

The advantages, the features, and a method of achieving it of the present disclosure will become more apparent with reference to the exemplary embodiments below. However, the present disclosure is not limited to the embodiments set forth below and may be implemented in many different manners. Rather, these embodiments are provided so that this disclosure will be thorough and complete, and will fully convey the scope of the disclosure to those skilled in the art to which the disclosure pertains. The present disclosure is only defined by the scope of claims. Like reference numerals refer to like elements throughout the specification.

In the drawings, the thicknesses are enlarged to clearly express many layers and regions. In the drawings, for the convenience of explanation, the thicknesses of some layers and regions are exaggerated.

It will also be understood that when a layer, a film, a region, a plate, and the like are referred to as being "on" or "at an upper portion" of another portion, it includes the case of being "directly on" the another portion and the case in which a third portion is provided between the layer, the film, the region, the plate, and the like and another portion. Conversely, when a part is "directly on" another part, it means that there is no a third part in the middle thereof. Further, when the parts such as the layer, the film, the region, the plate, and the like are referred to as being "under" or "at a lower portion" of another part, it includes the case in which the parts such as the layer, the film, the region, the plate, and the like are "directly under" another part and the case in which a third part is provided in the middle thereof. Conversely, when a part is provided "directly under" another part, it means that there is no third part in the middle thereof.

In one embodiment of the present disclosure, there is provided a decoration sheet that sequentially includes a layer of thermosetting resin, a deposition layer, and a substrate layer, and the layer of the thermosetting resin includes a fine pattern on the surface thereof, and the elongation of the sheet is about 200% to about 300%.

FIG. 1 schematically shows a structure of the decoration sheet 100.

Referring to FIG. 1, the decoration sheet 100 sequentially includes a layer of the thermosetting resin 110, a deposition layer 120, and a substrate layer 130.

Further, referring to FIG. 1, a pattern may be formed on the layer of the thermosetting resin.

A UV cured layer was able to be used as the surface layer of the conventional decoration sheet. However, when the surface layer of the conventional decoration sheet is made of UV curing resin, a surface hardness may be increased, but the elongation of the decoration sheet tends to deteriorate, thereby making it possible to be difficult to form a three-dimensional shape. In order to solve the problem, the layer of the thermosetting resin may be used as the surface layer of the decoration sheet. The layer of the thermosetting resin is a layer using the thermosetting resin and has excellent elongation in comparison to using the layer of the UV curing resin as the decorative surface layer.

The layer of the thermosetting resin may be located at an outermost portion of the decoration sheet and may function as a so-called hard coating layer.

The layer of the thermosetting resin has the fine pattern formed on the surface thereof and functions as decoration through the fine pattern. Further, the properties such as abrasion, durability, a prevention of contamination, scratch-resistance of the product surface may be provided to the layer of the thermosetting resin.

The fine pattern may have a depth of about 1 man to about 50 μm and a pitch of about 1 μm to about 100 μm. The depth and the pitch may be measured using, for example, a confocal laser scanning microscope (CLSM).

Figure 3:
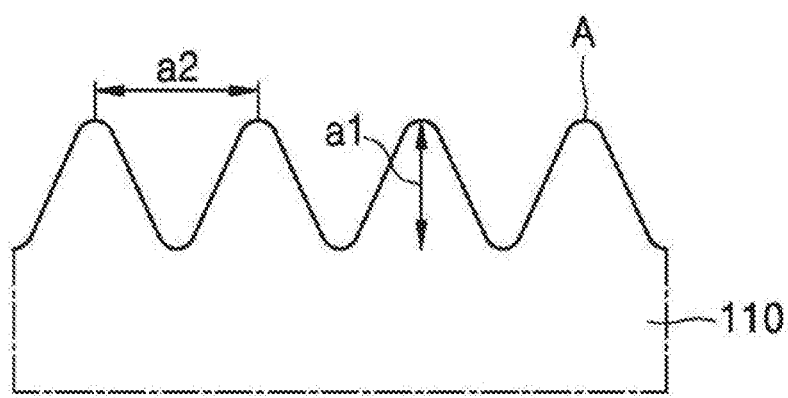
FIG. 3 is a schematic cross-sectional view of an enlarged fine pattern according to another embodiment of the present disclosure

FIG. 3 is an enlarged schematic view of the fine pattern (A).

Referring to FIG. 3, the fine pattern A includes a depth a1 and a pitch a2.

The fine pattern may be referred to as "a pattern of the layer of the thermosetting resin having a curve" and may include geometric patterns and irregular patterns. The depth may represent an average depth of the curve from an outermost surface of the layer of the thermosetting resin that forms the pattern, as seen in the cross-section of the layer of the thermosetting resin having the pattern formed. Further, the pitch may represent an average width of the curves as seen in a cross-section of the layer of the thermosetting resin having the pattern formed.

As the pattern has the range of depth, excellent productivity, excellent workability, and excellent design may be provided. When the range of depth of the pattern is less than the above range, the pattern formation is difficult and the productivity deteriorates. When the range of the depth of the pattern exceeds the above range, a release of the photocurable imprint film described in the method for manufacturing the decoration sheet described below may be difficult and the physical properties of the decoration sheet may be deteriorated.

The layer of the thermosetting resin may include a thermosetting material of coating liquid of the thermosetting resin including the thermosetting resin and the thermosetting agent.

The thermosetting resin may include one selected from the group consisting of acrylic resin, epoxy resin, polyurethane resin, and a combination thereof.

The coating liquid of the thermosetting resin may include about 10% by weight to about 40% by weight of the thermosetting resin. If the amount of the thermosetting resin is less than the above range, the hardness and the durability of the layer of the thermosetting resin may be deteriorated. If the amount of the thermosetting resin exceeds the above range, a releasable property of the photocurable imprint film may be lowered.

The layer of the thermosetting resin may have an average thickness of from about 5 μm to about 50 μm. The average thickness of the layer of the thermosetting resin may signify a thickness in the absence of a protrusion or a concave recess from and in the surface of the layer of the thermosetting resin when the layer of the thermosetting resin does not include the fine pattern, that is, the layer of the thermosetting resin is considered to have a flat plane.

If the thickness of the layer of the thermosetting resin is less than the above range, the kinds of the fine pattern that may be provided in relation to the depth of the fine pattern is limited. If the thickness of the layer of the thermosetting resin exceeds the range, the elongation of the decoration sheet is rapidly reduced.

The deposition layer may include at least one selected from the group consisting of tin (Sn), indium (In), chromium (Cr), and a combination thereof.

The deposition layer may have a thickness of about 5 nm to about 250 nm.

When the deposition layer has a thickness less than the above range, it is difficult to firmly deposit the layer of the thermosetting resin and the substrate layer. When the deposition layer has a thickness exceeding the above range, the deterioration in formability and adhesiveness, and the deterioration in color caused by white turbidity phenomenon may occur.

The substrate layer may include, for example, thermoplastic resin, and the thermoplastic resin may include, but is not limited to, for example, at least one selected from the group consisting of acrylonitrile butadiene styrene (ABS), vinyl chloride resin, polystyrene resin, acrylic resin, polyamide resin, polyethylene resin, and a combination thereof.

The substrate layer may have a thickness of about 10 am to about 500 an.

A primer layer may be further provided between the layer of the thermosetting resin and the deposition layer; between the deposition layer and the substrate layer; or between the layer of the thermosetting resin and the deposition layer; between the deposition layer and the substrate layer.

The primer layer improves the durability of the decoration sheet by increasing an adhesive force between the respective layers. The primer layer may be formed by applying and thermally curing a primer composition to the surface of a target layer according to a known printing method or applying method.

The primer composition may include at least one selected from the group consisting of acrylic urethane resin, vinyl resin, polyester resin and a combination thereof.

The thickness of the primer layer may be about 0.5 μm to about 5 μm, and the thickness of the primer layer may be changed by varying viscosity of a solution phase of the resin. Specifically, the thickness of the primer layer may be controlled by a gravure printing roll or a microgravure printing roll used. The printing roll may be classified into the gravure printing roll and the microgravure printing roll depending on a mesh size and a depth, and the mesh size means the number of diagonal lines per unit area. The microgravure printing roll has a greater number of diagonal lines per unit area than the gravure printing roll, but has a low depth, and an amount of the coating composition adhering to the pocket is less so that the microgravure printing roll may be coated with a thinner thickness than the gravure printing roll.

In another embodiment of the present disclosure, there is provided a method for manufacturing a decoration sheet, comprising: forming a photocurable imprint film having a layer of photocurable resin including an original pattern on one surface thereof and a transparent layer laminated on the other surface of the layer of photocurable resin; applying coating liquid of the thermosetting resin on one surface including the original pattern of the layer of photocurable resin and thermally curing the applied coating liquid of the thermosetting resin to form a layer of thermosetting resin including a pattern having a reverse phase of the original pattern on one surface in contact with the layer of the photocurable resin; forming a deposition layer on the other surface of the layer of the thermosetting resin; forming a substrate layer on one side of the deposition layer; and releasing the photocurable imprint film from the layer of the thermosetting resin. The decoration sheet described in one embodiment may be manufactured through the method for manufacturing the decoration sheet.

Figure 2:
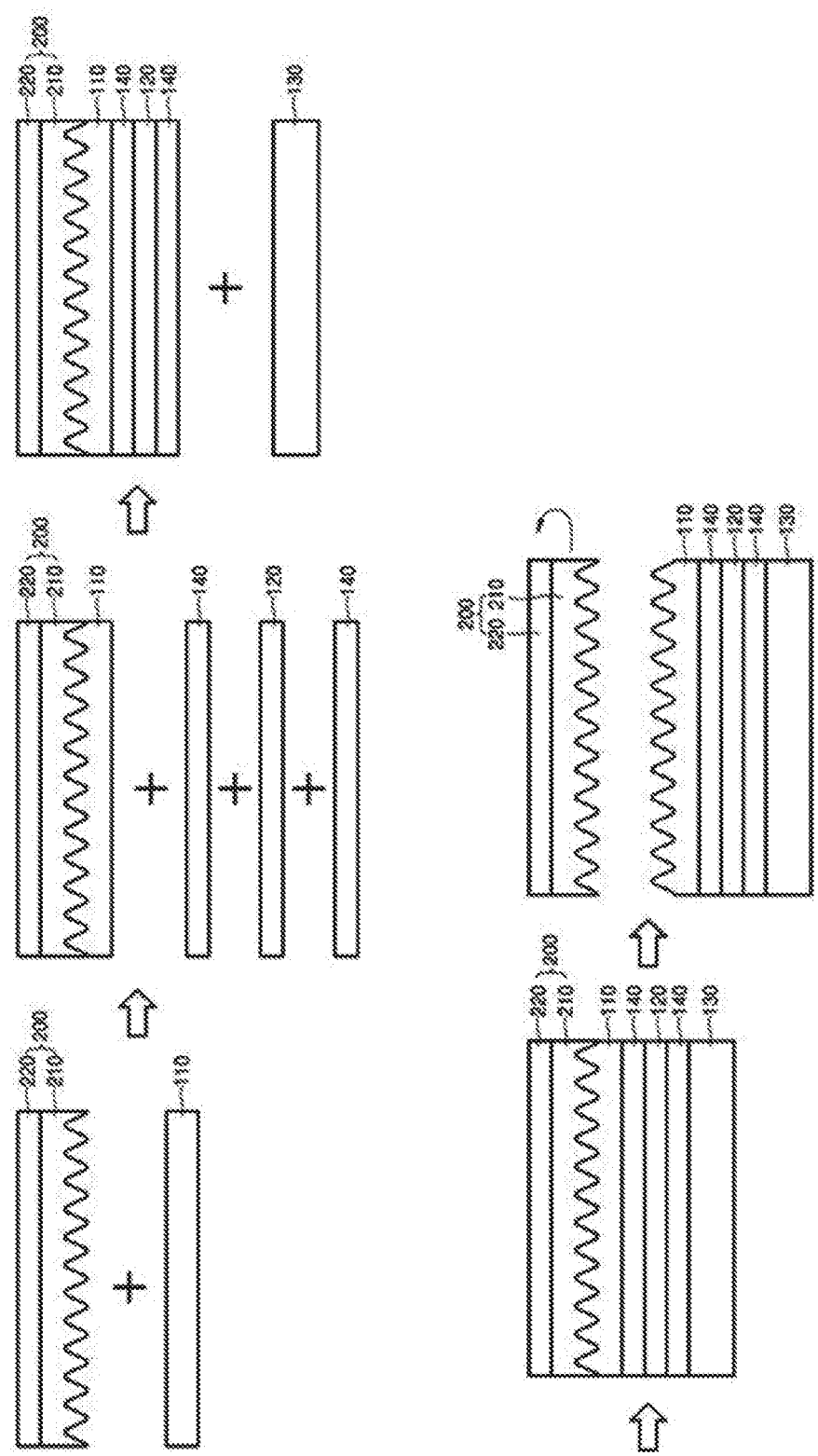
FIG. 2 is a schematic process flow diagram showing a method for manufacturing a decoration sheet according to an embodiment of the present disclosure.

FIG. 2 shows a schematic process sequence of a method for manufacturing the decoration sheet. Referring to FIG. 2, a fine pattern may be formed on the layer of the thermosetting resin 110 using the photocurable imprint film 200.

In the above method for manufacturing the decoration sheet, a photocurable imprint film in which a layer of photocurable resin including an original pattern on one side thereof and a transparent layer on the other side of the layer of the photocurable resin are laminated may be formed.

The photocurable imprint film may include, for example, applying coating liquid of photocurable resin onto a metal plate material including a predetermined pattern on a surface thereof; closely contacting a transparent film onto the applied coating liquid; and transmitting light onto the applied coating liquid and the transparent film closely contacting the applied coating liquid to form a layer of the photocurable resin. Then, the photocurable imprint film may be obtained by releasing the laminate in which the layer of the photocurable resin and the transparent film including the transparent film are laminated from the metal plate. A pattern having a shape opposite to a predetermined pattern included in the surface of the metal plate may be transferred onto the layer of the photocurable resin.

For example, in the step of applying the coating liquid of the photocurable resin to the metal plate, the coating liquid of the photocurable resin may be applied in a thickness of about 1 μm to about 50 μm.

Further, for example, the pattern of the layer of the photocurable resin may be formed using an embossing roll, and the like.

The coating liquid of the photocurable resin may include a photocurable compound, a silicone compound, and a photoinitiator.

The photocurable compound may include at least one selected from the group consisting of acrylic monomers, oligomers thereof, resin thereof, and a combination thereof.

Examples of the acrylic monomer may include acrylate or urethane acrylate including an alkyl group having 1 to 12 carbon atoms, and specific examples of the acrylic monomer include butyl acrylate, hexyl acrylate, n-octyl acrylate, isooctyl acrylate, 2-ethylhexyl acrylate, isononyl acrylate or other (meth) acrylate monomers, and the like but are not limited thereto.

The coating liquid of the photocurable resin may include about 50% by weight to about 99% by weight of the photocurable compound.

The radical initiators well known in the art such as 2,2'-azobisisobutyronitrile (AIBN), benzoyl peroxide (BPO), and the like may be used as the photoinitiator.

The silicone compound may include at least one selected from the group consisting of polyether-modified polydialkylsiloxane, acryl-functional polydialkylsiloxane, and a combination thereof. The polydialkylsiloxane may be, for example, polydimethylsiloxane, but is not limited thereto.

The transparent film may include at least one selected from the group consisting of polyester resin, acrylic resin, urethane resin, lepin resin, but is not limited thereto.

The method for manufacturing the decoration sheet includes applying coating liquid of thermosetting resin on one surface thereof including an original pattern of the layer of the photocurable resin and thermally curing the applied coating liquid of the photocurable resin to form a layer of thermosetting resin including a pattern having a reverse phase to the original pattern on one surface in contact with the layer of the photocurable resin. The original pattern may refer to a pattern included in one side of the layer of the photocurable resin, and the pattern having the reverse phase may refer to a pattern opposite to the original pattern.

The original pattern of the layer of the photocurable resin may be a fine pattern, and thus the pattern having the reverse phase included in one surface of the layer of the thermosetting resin may also be the fine pattern. The fine pattern is as described above in one embodiment.

The coating liquid of the thermosetting resin is described above in one embodiment.

The coating liquid of the thermosetting resin may be applied onto one side of the layer of the photocurable resin in a thickness of about 5 μm to about 50 μm. If the applied thickness is less than the above range, providing the pattern may be degraded. If the thickness of the coating liquid of the thermosetting resin exceeds the above range, a residue of the solvent and failure of coating may occur.

The thermosetting may be performed by heat-treating at a temperature of about 100° C. to about 130° C. for about 0.5 minutes to about 2 minutes. The layer of the thermosetting resin having improved shape stability in pattern may be manufactured by performing the heat treatment within the temperature and time ranges.

In the above method, a deposition layer may be formed on the other surface of the layer of the thermosetting resin. The deposition layer may be formed using a magnetron sputtering deposition (Selcos Cetus-S), an electron beam deposition, and the like, but is not limited thereto.

Further, the substrate layer may be formed on one side of the deposition layer. For example, the substrate layer may be formed by applying and curing a thermoplastic resin composition including thermoplastic resin on one side of the deposition layer or may be formed by laminating the thermoplastic resin film on the deposition layer, but is not limited thereto.

The above method for manufacturing the decoration sheet may further include forming a primer layer between the layer of the thermosetting resin and the deposition layer; between the deposition layer and the substrate layer; or between the layer of the thermosetting resin and the deposition layer and between the deposition layer and the substrate layer.

In the above method for manufacturing the decoration sheet, the photocurable imprint film may be released from the layer of the thermosetting resin, so that the decoration sheet may be obtained. The photocurable imprint film has low elongation and may release the photocurable imprint film to improve the elongation of the decoration sheet.

Hereinafter, specific embodiments of the present disclosure will be described. However, the embodiments described below are only intended to specifically illustrate or explain the present disclosure, and thus the present disclosure should not be limited thereto.

EMBODIMENTS AND COMPARATIVE EXAMPLES

Embodiment 1

Acrylate resin solution including 10% by weight of 2,2'-azobis-isobutironitrilo (AIBN) based on 100% by weight of urethane acrylate as coating liquid of photocurable resin was applied onto a surface of an aluminum plate in which a pattern having a depth of 20 μm and a pitch of 10 μm is formed in a thickness of 10 μm. Then, polyethylene terephthalate (PET) film having the thickness of 38 μm closely contacted the coating liquid and ultraviolet rays were transmitted onto the laminated film at an intensity of radiation of 400 mJ/cm$^2$ and coating liquid of the photocurable resin was cured to prepare a photocurable imprint film.

When the photocurable imprint film was prepared, an aluminum plate was separated from the photocurable imprint film to confirm the pattern formed on the surface of the photocurable imprint film.

The coating liquid of the thermosetting resin was prepared by mixing thermosetting resin (acryl, 20 wt %), acryl-functional polydimethylsiloxane (1 wt %) and acetone phenon (5 wt %).

The coating liquid of the thermosetting resin was applied onto the photocurable imprint film in a thickness of 50 μm and thermally cured. Then, a primer layer (acryl urethane) was coated in a thickness of 5 μm, a deposition layer (Sn) was coated in a thickness of 25 nm, and a primer layer (acrylate) was coated in a thickness of 5 μm sequentially and they were thermally cured. The thermal coating was performed by thermally treating it at a temperature of 120° C. for 1 minute and was transferred on the substrate layer (ABS) having a final thickness of 200 μm finally.

After the thermo-curing and transferring, the photocurable imprint film was released.

Embodiment 2

A decoration sheet was manufactured under the same conditions and in the same manner as in Example 1, except that a silicone compound was not present in the layer of the photocurable resin.

Comparative Example 1

An acrylate resin solution including 10 parts by weight of 2,2'-azobisisobutyronitrile (AIBN) based on 100 parts by weight of urethane acrylate as coating liquid of photocurabe resin was applied onto a surface of an aluminum plate having a pattern of a depth of 20 μm and a pitch of 10 μm formed in a thickness of 10 μm. Then, polyethylene terephthalte (PET) film having a thickness of 38 μm closely cotacted onto the coating liquid and ultraviolet rays were transmitted at an intensity of radiation of 400 mJ/cm$^2$ and the coating liquid of the photocurable resin was cured to prepare a photocurable imprint film.

When the photocurable imprint film was produced, the aluminum plate was separated from the photocurable imprint film to confirm a pattern formed on the surface of the photocurable imprint film.

A primer layer (acryl urethane) was coated in a thickness of 5 μm and a deposition layer (Sn) was coated in a thickness of 25 nm, and a primer layer (acrylate) was coated in a thickness of 5 μm sequentially on the photocurable imprint film, and the coated layers are thermally cured at a temperature of 120° C. for 1 minute to finally transfer it onto the substrate layer (ABS) having a thickness of 200 μm.

After the thermo-curing and transferring, the photocurable imprint film was released.

<Evaluation>

The following properties of the decoration sheet of the Embodiments and Comparative Examples were evaluated, and the results thereof are shown in Table 1.

Experimental Example 1: Evaluation of Elongation (%)

A decorative sheet according to the above-described Embodiments and Comparative Examples was evaluated for elongation according to an ASTM-D882 method. Specifically, after a sample having a width of 10 mm and a length of 150 mm was marked in an interval of 10 mm at the central region thereof and leaving the sample in a hot plate of 100° C. for 3 minutes, a deformation of a portion without abnormality on a surface of the sample was measured when the sample was pulled from both sides. The elongation is calculated according to length of deformation (ΔL)/initial length (L: 10 mm)×100.

Experimental Example 2: Evaluation of Sun Cream Resistance 0.25 g of sun cream (SP+++50) was applied onto a decoration sheet according to the above Embodiments and Comparative Examples, and then the decoration sheet to which the sun cream is applied is placed on a sheet. Then, the sheet was covered with an acrylic plate, and then left in an oven at 80° C. for 1 hour, and taken out from the oven again and the sheet to which the sun cream is applied is cooled for 1 hour. Thereafter, changes in state of the surface of the decoration sheet were evaluated after cleaning the sun cream with a neutral detergent. Swelling, discoloration, occurrence of cracks, contamination resistance, and the like were evaluated.

Experimental Example 3: Evaluation of Ease of Releasing Photocurable Imprint Film The photocurable imprint film was released from a decoration sheet according to the above-described embodiment to evaluate a state change of the surface of the layer of the thermosetting resin. Specifically, evaluation was made as to whether the photocurable imprint film was attached to or damaged on a surface of the layer of the thermosetting resin.

TABLE 1

| Classification | Elongation (%) | Sun cream resistance | Ease of release |
|---|---|---|---|
| Embodiment 1 | 200% | Good | Good |
| Embodiment 2 | 130% | Good | Insignificant damage |
| Comparative Example 1 | 70% | Swelling, fine discoloration | Not tested |

As shown in Table 1, the decoration sheet according to Examples 1 and 2 may ensure excellent elongation and excellent sun cream resistance, and in particular, in Embodiment 1, the decoration sheet has excellent releasing property, thereby having an excellent level of properties of the decoration sheet.

On the other hand, it was clearly confirmed that the decoration sheet according to Comparative Example 1 was significantly inferior in elongation and sun cream resistance.

DESCRIPTION OF SYMBOLS

100: Decoration sheet
110: Layer of thermosetting resin
120: Deposition layer
130: Layer of base material
140: Primer layer
200: Photocurable imprint film
210: Layer of photocurable resin
220: Transparent film
A: Fine pattern
a1: Depth
a2: Pitch

The invention claimed is:

1. A method for manufacturing a decoration sheet, comprising:
   forming a photocurable imprint film, wherein the photocurable imprint film comprises:
      a photocurable resin layer having a first pattern on a first surface thereof, wherein the photocurable resin layer is formed by curing a coating liquid of a photocurable resin, wherein the coating liquid of the photocurable resin comprises a silicone compound, and wherein the silicone compound comprises at least one selected from the group consisting of polyether-modified polydialkylsiloxane, acryl-functional polydialkylsiloxane, and a combination thereof; and
      a transparent layer on a second surface of the photocurable resin layer;
   forming a thermosetting resin layer having a second pattern on a first surface thereof, wherein the thermosetting resin layer is formed by curing a coating liquid of the thermosetting resin including not less than 10% by weight to not more than 40% by weight of the thermosetting resin, wherein the second pattern has a reverse phase to the first pattern, and wherein forming the thermosetting resin layer comprises:
      applying the coating liquid of the thermosetting resin on the first surface of the photocurable resin layer; and
      thermally curing the applied coating liquid of the thermosetting resin;
   forming a deposition layer on a second surface of the thermosetting resin layer, wherein the deposition layer comprises a metallic material selected from the group consisting of tin (Sn), indium (In), and combinations thereof;
   forming a substrate layer on one surface of the deposition layer; and
   releasing the photo curable imprint film from the thermosetting resin layer.

2. The method for manufacturing the decoration sheet of claim 1, wherein thermally curing the applied coating liquid of the thermosetting resin comprises heat-treating at a temperature ranging from 100° C. to 130° C. for 0.5 minute to 2 minutes.

3. The method for manufacturing the decoration sheet of claim 1, wherein the thermosetting resin comprises at least one selected from the group consisting of acrylic resin, epoxy resin, and polyurethane resin.

4. The method for manufacturing the decoration sheet of claim 1, wherein the second pattern has a depth ranging from 1 μm to 50 μm and a pitch ranging from 1 μm to 100 μm.

5. The method for manufacturing the decoration sheet of claim 1, wherein an average thickness of the thermosetting resin layer ranges from 5 μm to 50 μm.

6. The method for manufacturing the decoration sheet of claim 1, wherein the thickness of the deposition layer ranges from 5 nm to 250 nm.

7. The method for manufacturing the decoration sheet of claim 1, further comprising:
   forming a first primer layer between the thermosetting resin layer and the deposition layer.

8. The method for manufacturing the decoration sheet of claim 1, further comprising:
   forming a second primer layer between the deposition layer and the substrate layer.

9. The method for manufacturing the decoration sheet of claim 1, wherein an elongation of the decoration sheet ranges from 200% to 300%.

* * * * *